(12) United States Patent
Kim et al.

(10) Patent No.: US 8,158,466 B2
(45) Date of Patent: Apr. 17, 2012

(54) ARRAY SUBSTRATE FOR DISPLAY DEVICE AND METHOD OF FABRICATING THE SAME

(75) Inventors: Yong-Yub Kim, Paju-si (KR); Chang-Il Ryoo, Seoul (KR)

(73) Assignee: LG Display Co., Ltd., Seoul (KR)

( * ) Notice: Subject to any disclaimer, the term of this patent is extended or adjusted under 35 U.S.C. 154(b) by 98 days.

(21) Appl. No.: 12/631,796

(22) Filed: Dec. 4, 2009

(65) Prior Publication Data

US 2010/0308324 A1    Dec. 9, 2010

(30) Foreign Application Priority Data

Jun. 3, 2009    (KR) .................. 10-2009-0049214

(51) Int. Cl.
*H01L 21/00* (2006.01)

(52) U.S. Cl. .......... 438/149; 438/30; 438/150; 438/151; 438/164; 257/E27.111; 257/E51.005

(58) Field of Classification Search .............. 438/30, 438/149, 151, 154; 257/59, E27.111, E51.005; 349/43
See application file for complete search history.

(56) References Cited

U.S. PATENT DOCUMENTS

| 7,935,579 B2 * | 5/2011 | Park et al. ............... 438/149 |
| 2008/0003728 A1 * | 1/2008 | Hwang et al. ............ 438/151 |
| 2008/0258140 A1 * | 10/2008 | Lee et al. ................ 257/43 |
| 2008/0299702 A1 | 12/2008 | Son et al. |
| 2009/0008667 A1 * | 1/2009 | Fujii et al. ............... 257/98 |
| 2009/0167974 A1 * | 7/2009 | Choi et al. .............. 349/43 |
| 2010/0213460 A1 | 8/2010 | Kondo et al. |

FOREIGN PATENT DOCUMENTS

| CN | 101814529 A | 8/2010 |
| WO | WO 2009/022563 A1 | 2/2009 |

OTHER PUBLICATIONS

M. Z. Balgag, S. Pat, I. Cenik, N. Ekem, T. Akan, B. Baksan, Titanium Oxidation by Pulsed Oxygen Plasma, Journal of Optoelectronics and Advanced Material, vol. 10, No. 3, Mar. 2008, p. 680-682.*

* cited by examiner

*Primary Examiner* — Steven Loke
*Assistant Examiner* — Cuong Nguyen
(74) *Attorney, Agent, or Firm* — Birch, Stewart, Kolasch & Birch, LLP

(57) ABSTRACT

An array substrate including a substrate having a pixel region, a gate line and a gate electrode on the substrate, the gate electrode being connected to the gate line, a gate insulating layer on the gate line and the gate electrode, an oxide semiconductor layer on the gate insulating layer, an auxiliary pattern on the oxide semiconductor layer, and source and drain electrodes on the auxiliary pattern, the source and drain electrodes being disposed over the auxiliary pattern and spaced apart from each other to expose a portion of the auxiliary pattern. Further, the exposed portion of the auxiliary pattern exposes a channel region and including a metal oxide over the channel region. Also included is a data line over the gate insulating layer, the data line crossing the gate line to define the pixel region and being connected to the source electrode, a passivation layer on the source and drain electrodes and the data line, the passivation layer having a drain contact hole exposing the drain electrode, and a pixel electrode on the passivation layer, the pixel electrode being connected to the drain electrode through the drain contact hole.

11 Claims, 11 Drawing Sheets

ARRAY SUBSTRATE FOR DISPLAY DEVICE AND METHOD OF FABRICATING THE SAME

CROSS-REFERENCE TO A RELATED APPLICATION

The present application claims the benefit of Korean Patent Application No. 2009-0049214 filed on Jun. 3, 2009, which is hereby incorporated by reference in its entirety.

BACKGROUND OF THE INVENTION

1. Field of the Invention

The present application relates to an array substrate including a thin film transistor having an oxide semiconductor layer and a method of fabricating the array substrate.

2. Discussion of the Related Art

Display devices such as liquid crystal display (LCD) devices or electroluminescent display (ELD) devices having a light weight, thin profile, and low power consumption have replaced cathode ray tube (CRT) devices. Among the LCD devices, the active matrix LCD (AM-LCD) devices use switching elements and pixel electrodes arranged in a matrix structure and have high resolution and superior suitability for displaying moving images.

In addition, organic electroluminescent display (OELD) devices are an emissive type display and have a high brightness and low driving voltage. The OLED devices also have advantages such as a high contrast ratio, ultra thin profile, short response time of about several microseconds, wide viewing angle and stability at low temperature. For example, the OLED devices can be driven with a driving voltage of about 5V DC to about 15V DC.

In addition, the LCD OLED devices include an array substrate having a thin film transistor as a switching element for a pixel region. For example, FIG. 1 is a cross-sectional view illustrating a related art array substrate. The related art array substrate shown in FIG. 1 includes a gate line (not shown) and a gate electrode 15 formed in a pixel region P on a substrate 11, and a gate insulating layer 18 formed on the gate line and the gate electrode 15. Also included is a semiconductor layer 28 including an active layer 22 of intrinsic amorphous silicon and an ohmic contact layer 26 of impurity-doped amorphous silicon formed on the gate insulating layer 18 over the gate electrode 15. Source and drain electrodes 36 and 38 spaced apart from each other are also formed on the ohmic contact layer 26.

Further, the gate electrode 15, the gate insulating layer 18, the semiconductor layer 28, the source electrode 36 and the drain electrode 38 constitute a thin film transistor (TFT) Tr. In addition, a passivation layer 42 is formed on the TFT Tr and has a drain contact hole 45 exposing the drain electrode 38. A pixel electrode 50 is also formed on the passivation layer 42 in the pixel region P, and the pixel electrode 50 is connected to the drain electrode 38 through the drain contact hole 45.

A data line 33 including patterns 20 (i.e., first and second patterns 27 and 23) are then formed on the substrate 11 and crosses the gate line to define the pixel region P. The first and second patterns 27 and 23 also have the same layers as the ohmic contact layer 26 and the active layer 22, respectively. Further, the active layer 22 of the semiconductor layer 28 has a first portion exposed through the ohmic contact layer 26 and a second portion under the ohmic contact layer 26. The first and second portions of the active layer 22 also have first and second thicknesses t1 and t2 that are different from each other (t1≠t2). The thickness difference of the active layer 22 results from a fabrication method and causes a degradation in the characteristic of the TFT Tr.

Next, FIGS. 2A to 2E are cross-sectional views showing a process of forming a semiconductor layer, a source electrode and a drain electrode on an array substrate for a related art display device. In addition, a gate electrode and a gate insulating layer between the array substrate and the semiconductor layer are omitted in FIGS. 2A to 2E. As shown in FIG. 2A, an intrinsic amorphous silicon layer 20, an impurity-doped silicon layer 24 and a metal layer 30 are sequentially formed on the substrate 11. After a photo resist (PR) layer is formed on the metal layer 30, light is irradiated onto the PR layer using a photo mask to form a first PR pattern 91 corresponding to the source and drain electrodes and a second PR pattern 92 corresponding to the first portion exposed through the source and drain electrodes 36 and 38 in FIG. 1. The first and second PR patterns 91 and 92 also have third and fourth thicknesses t3 and t4 in which the fourth thickness is smaller than the third thickness (t4<t3).

Also, in FIG. 2B, the metal layer 30, the impurity-doped silicon layer 24 and the intrinsic amorphous silicon layer 20 in FIG. 2A are etched using the first and second PR patterns 91 and 92 as an etching mask so that a source-drain pattern 31, an impurity-doped amorphous silicon pattern 25 and the active layer 22 can be formed. In FIG. 2C, the second PR pattern 92 in FIG. 2C is removed and the first PR pattern 91 in FIG. 2C is partially removed through an ashing process so that a third PR pattern 93 having a reduced thickness can be formed on the source-drain pattern 31.

Further, in FIG. 2D, the source-drain pattern 31 in FIG. 2C is etched using the third PR pattern 93 as an etching mask so that the source and drain electrodes 36 and 38 can be formed and the impurity-doped amorphous silicon pattern 25 can be exposed between the source and drain electrodes 36 and 38. In FIG. 2E, the impurity-doped amorphous silicon pattern 25 in FIG. 2D exposed between the source and drain electrodes 36 and 38 is etched through a dry etching step so that the ohmic contact layer 26 can be formed under the source and drain electrodes 36 and 38. When the dry etching step is performed for an insufficient time, the impurity-doped amorphous silicon pattern 25 remains on the active layer 22 between the source and drain electrodes 36 and 38.

The remaining impurity-doped amorphous silicon pattern 25 also connects the source and drain electrodes 36 and 38 to deteriorate the TFT Tr in FIG. 1. Thus, to remove the impurity-doped amorphous silicon pattern 25 exposed between the source and drain electrodes 36 and 38 completely, the dry etching step is performed for a sufficiently long time. Accordingly, the active layer 22 under the impurity-doped amorphous silicon pattern 25 exposed between the source and drain electrodes 36 and 38 is partially etched.

As a result, the first portion of the active layer 22 exposed through the ohmic contact layer 26 has the first thickness t1 and the second portion of the active layer 22 under the ohmic contact layer 26 has the second thickness t2 different from the first thickness t1 (t1≠t2). Also, the thickness difference of the active layer 22 causes degradation in the characteristic of the TFT Tr in FIG. 1. In addition, since the active layer 22 is partially removed during the drying etching step for the ohmic contact layer 26, the intrinsic amorphous silicon layer 20 in FIG. 2A is formed to have a thickness, for example, within a range of about 1500 Å to about 1800 Å. Accordingly, the deposition time for the intrinsic amorphous silicon layer 20 in FIG. 2A increases and the productivity is reduced.

SUMMARY OF THE INVENTION

Accordingly, one object of the present invention is to provide an array substrate for a display device that substantially obviates one or more of the problems due to limitations and disadvantages of the related art.

Another object of the present invention is to improve a thin film transistor by preventing a surface of an active layer from being exposed to an etching gas.

Yet another object of the present invention is to provide an array substrate including a thin film transistor having an oxide semiconductor layer and a method of fabricating the array substrate.

To achieve these and other advantages and in accordance with the purpose of the present invention, as embodied and broadly described, the present invention provides in one aspect an array substrate including a substrate having a pixel region, a gate line and a gate electrode on the substrate, the gate electrode being connected to the gate line, a gate insulating layer on the gate line and the gate electrode, an oxide semiconductor layer on the gate insulating layer, an auxiliary pattern on the oxide semiconductor layer, and source and drain electrodes on the auxiliary pattern. Further, the source and drain electrodes are disposed over the auxiliary pattern and spaced apart from each other to expose a portion of the auxiliary pattern. In addition, the exposed portion of the auxiliary pattern exposes a channel region and includes a metal oxide over the channel region. Also included is a data line over the gate insulating layer, the data line crossing the gate line to define the pixel region and being connected to the source electrode, a passivation layer on the source and drain electrodes and the data line, the passivation layer having a drain contact hole exposing the drain electrode, and a pixel electrode on the passivation layer, the pixel electrode being connected to the drain electrode through the drain contact hole.

In another aspect, the present invention provides a method of fabricating an array substrate, and which includes forming a gate line and a gate electrode on a substrate having a pixel region, the gate electrode being connected to the gate line, forming a gate insulating layer on the gate line and the gate electrode, forming an oxide semiconductor layer and an auxiliary pattern on the gate insulating layer, the auxiliary pattern including a conducting material, and forming source and drain electrodes on the auxiliary pattern and a data line over the gate insulating layer, the source and drain electrodes disposed over a first portion of the auxiliary pattern and spaced apart from each other to expose a second portion of the auxiliary pattern over a channel region, and the data line crossing the gate line to define the pixel region. The method also includes oxidizing the second portion of the auxiliary pattern of the conducting material into an insulating material, forming a passivation layer on the source and drain electrodes and the data line, the passivation layer having a drain contact hole exposing the drain electrode, and forming a pixel electrode on the passivation layer, the pixel electrode being connected to the drain electrode through the drain contact hole.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to the embodiments of the present invention, examples of which are illustrated in the accompanying drawings. Wherever possible, similar reference numbers will be used to refer to the same or similar parts.

Figure 1:
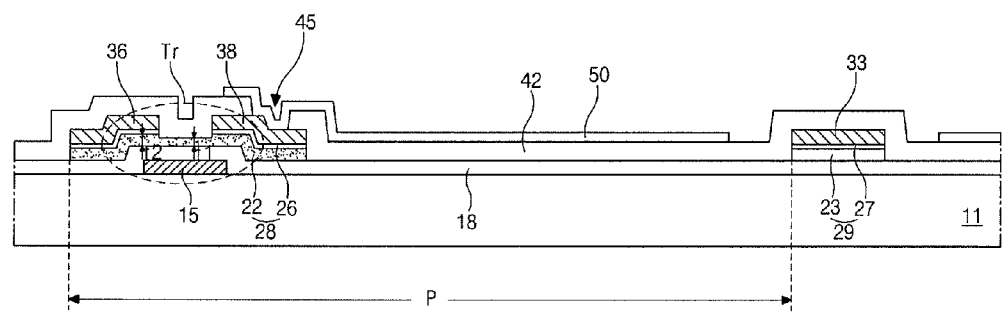
FIG. 1 is a cross-sectional view showing a related art array substrate.
Figure 2A:
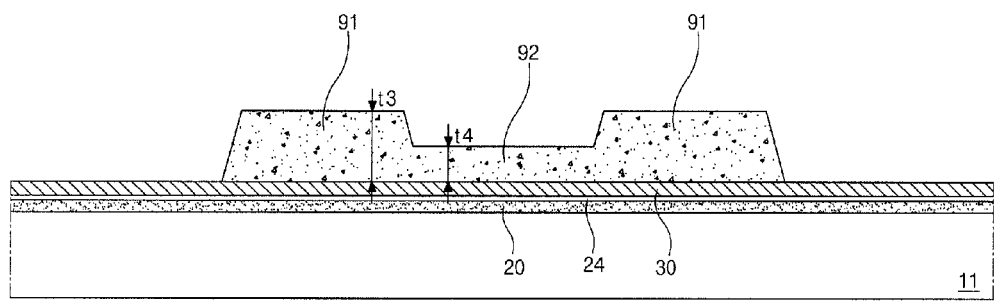
FIGS. 2A to 2E are cross-sectional views showing a method of forming a semiconductor layer, a source electrode and a drain electrode for a related art array substrate.
Figure 2B:
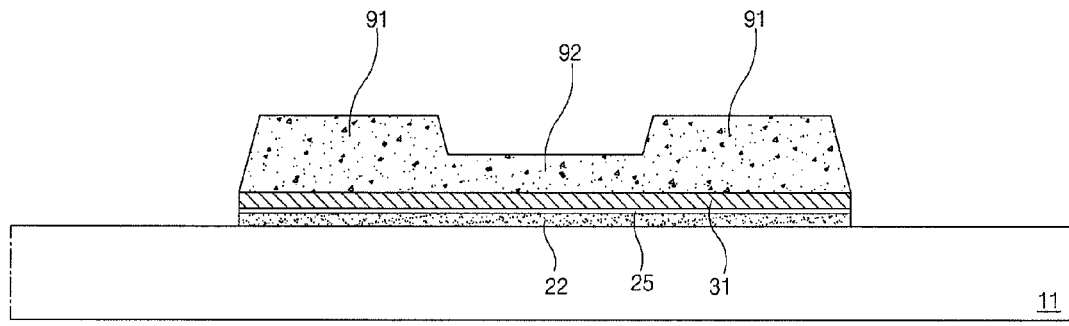
Figure 2C:
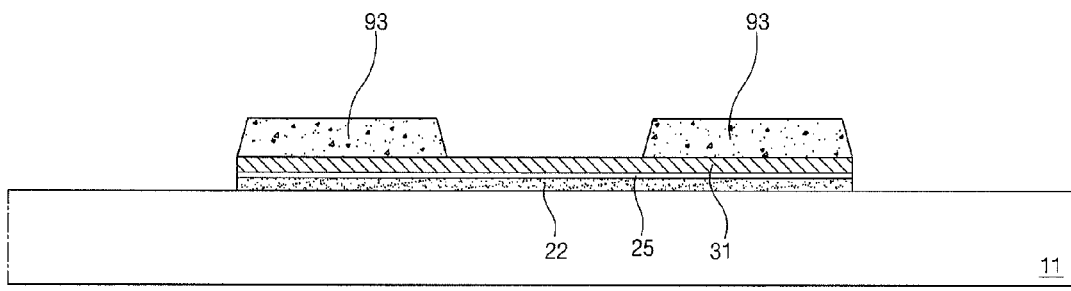
Figure 2D:
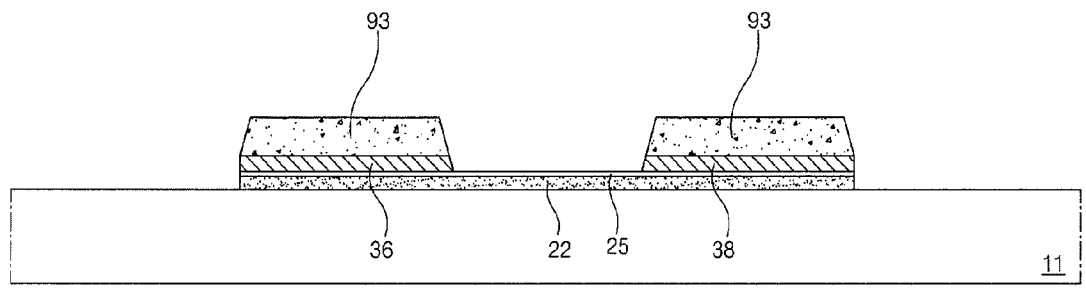
Figure 2E:
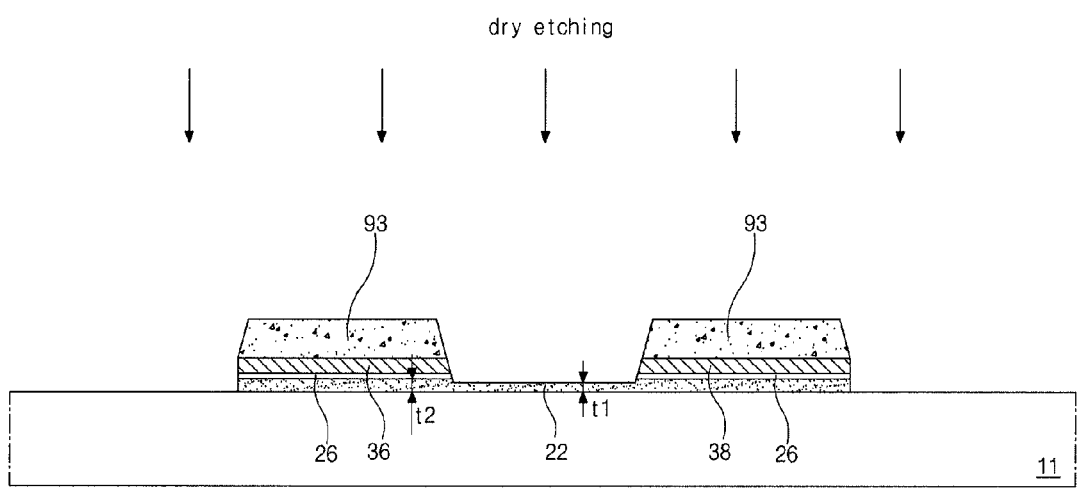
Figure 3A:
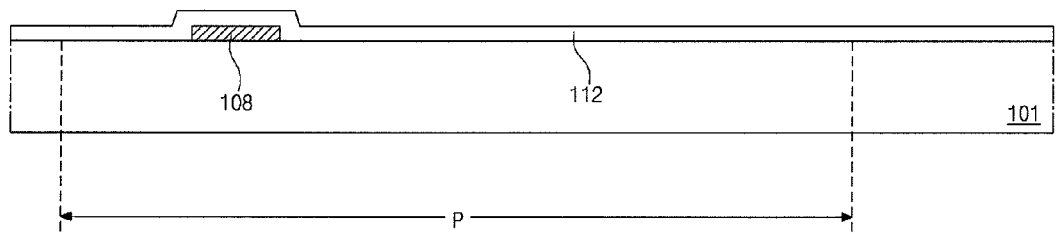
FIGS. 3A to 3J are cross-sectional views showing a method of fabricating an array substrate according to an embodiment of the present invention.

FIGS. 3A to 3J are cross-sectional views showing a method of fabricating an array substrate according to an embodiment of the present invention. In FIG. 3A, a first metal layer is formed on a substrate 101 having a pixel region P by depositing at least one of aluminum (Al), aluminum alloy (e.g., aluminum neodymium (AlNd)), copper (Cu) and copper alloy. The substrate 101 may be formed of glass or plastic, and the first metal layer may have a single layer structure or a double layer structure. Next, the first metal layer is patterned into a gate line and a gate electrode 108 through a mask process including a photoresist (PR) coating step, an exposure step using a photo mask, a developing step of an exposed PR pattern and an etching step.

The gate line is disposed along a side of the pixel region P, and the gate electrode 108 is connected to the gate line. Next, a gate insulating layer 112 is formed on the gate line and the gate electrode 108 by depositing an inorganic insulating material such as silicon oxide ($SiO_2$) and silicon nitride (SiNx). Further, the gate insulating layer 112 can be formed through a chemical vapor deposition (CVD) method.

Figure 3B:
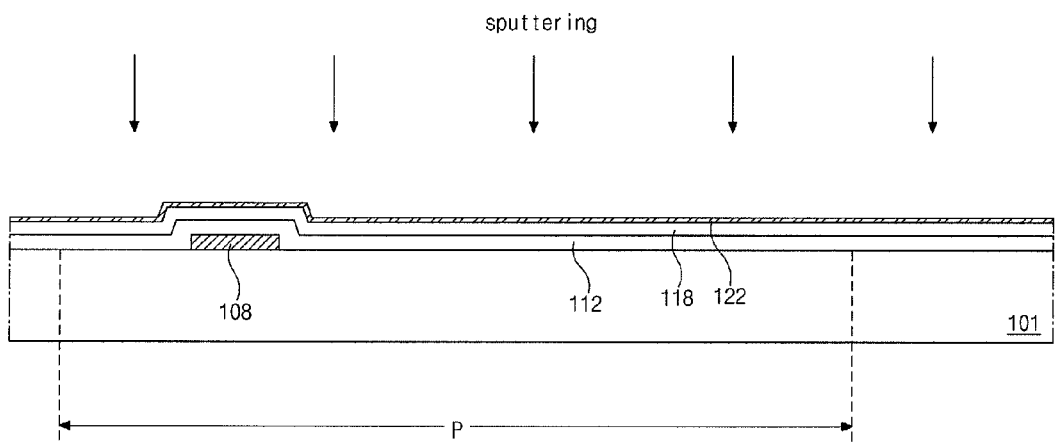

In addition, in the embodiment shown in FIG. 3B, an oxide semiconductor material layer 118 is formed on the gate insulating layer 112 by depositing an oxide semiconductor material such as amorphous indium gallium zinc oxide (a-IGZO) and zinc tin oxide (ZTO). The oxide semiconductor material layer 118 may be formed through a sputtering method and have a thickness of about 500 Å to about 1000 Å. Next, an auxiliary material layer 122 is formed on the oxide semiconductor material layer 118 by depositing titanium (Ti) or titanium alloy. The auxiliary material layer 122 may also be formed through a sputtering method and have a thickness of about 50 Å to about 500 Å. The auxiliary material layer 122 contacts the oxide semiconductor material layer 118 with an ohmic contact property. In addition, the auxiliary material layer 122 becomes an auxiliary insulating layer 126 in FIG. 3H through a subsequent oxygen (O2) plasma treatment.

Figure 3C:
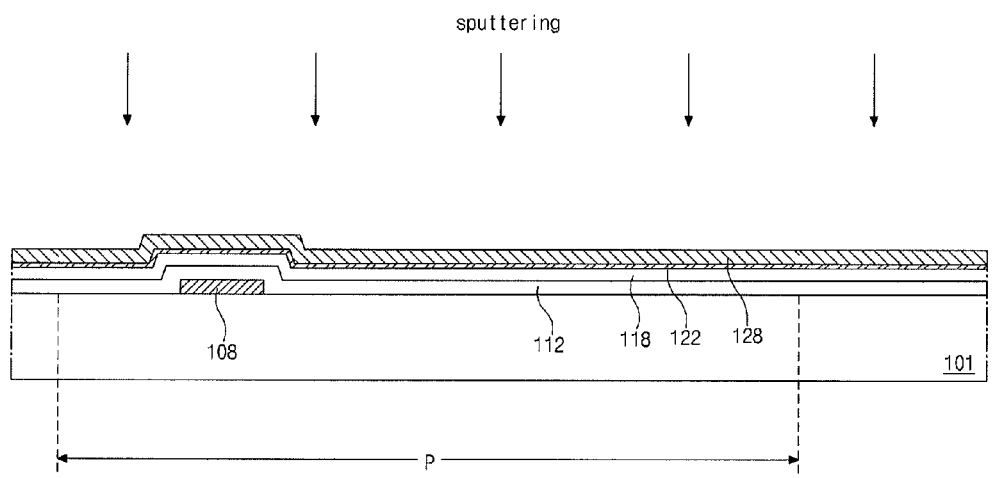

Further, as shown in FIG. 3C, a second metal layer 128 is formed on the auxiliary material layer 122 by depositing one of aluminum (Al), aluminum alloy (e.g., aluminum neodymium (AlNd)), copper (Cu), copper alloy, molybdenum (Mo) and chromium (Cr) through a sputtering method. Next, after a photoresist (PR) layer is formed on the second metal layer 128 by coating a photoresist, light is irradiated onto the PR layer through a photo mask. In addition, the photo mask includes a transmissive portion, a blocking portion and a half-transmissive portion such that a transmittance of the half-transmissive portion is greater than a transmittance of the blocking portion and is smaller than a transmittance of the transmissive portion. The transmissive portion may also include a slit pattern or a multiple-coating layer. The exposure process using the photo mask having the half-transmissive portion may be referred to as a diffraction exposure or a halftone exposure process.

Figure 3D:
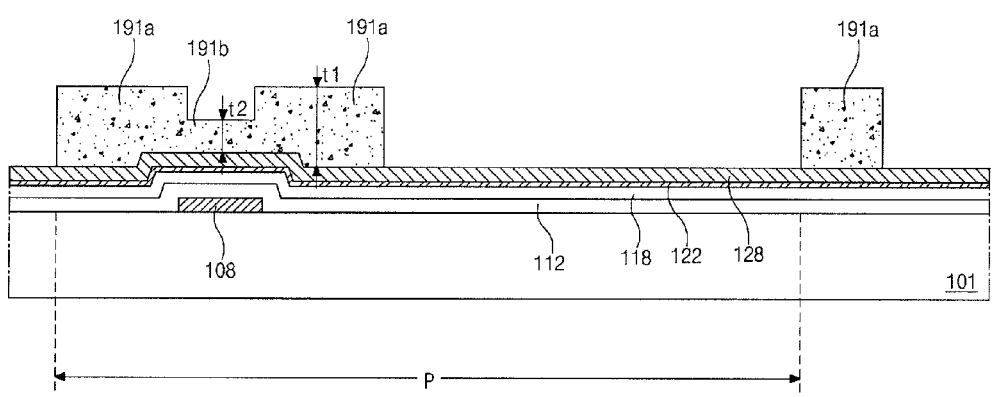
Figure 3E:
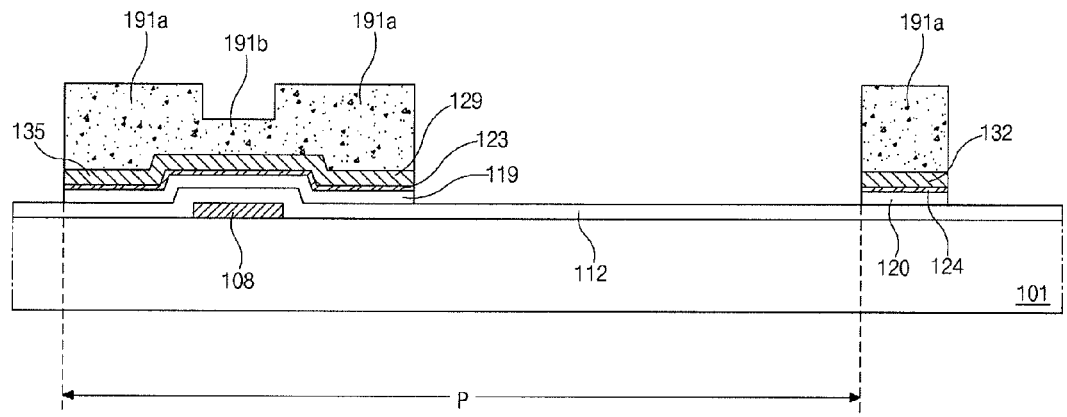

Next, as shown in FIG. 3D, the exposed PR layer is developed so that a first PR pattern 191a having a first thickness t1 and a second PR pattern having a second thickness t2 greater than the first thickness t1 is formed on the second metal layer 128 in the pixel region P. Also, as shown in FIGS. 3D and 3E, the first PR pattern 191a is formed on a portion of the second metal layer 128 corresponding to a data line 132, a source electrode 135 and a drain electrode 138 (see FIG. 3G), and the second PR pattern 191b is formed on a portion of the second metal layer 128 corresponding to a spacing between the source and drain electrodes 135 and 138. The other portions of the second metal layer 128 are exposed through the first and second PR patterns 191a and 191b.

Also, as shown in FIG. 3E, the second metal layer 128, the auxiliary material layer 122 and the oxide semiconductor material layer 118 in FIG. 3D are sequentially etched and removed using the first and second PR patterns 191a and 191b as an etching mask so that a first laminated pattern of a source-drain pattern 129, an auxiliary pattern 123 and an oxide semiconductor layer 119 and a second laminated pattern of a data line 132, a second dummy pattern 124 and a first dummy pattern 120 are formed on the on the gate insulating layer 112. The second metal layer 128, the auxiliary material layer 122 and the oxide semiconductor material layer 118 can also be patterned through a wet etching method using different etching solutions. Alternatively, the auxiliary material layer 122 can be patterned through a dry etching method.

In addition, the source-drain pattern 129 is connected to the data line 132, and the data line 132 crosses the gate line to define the pixel region P. The oxide semiconductor layer 119, the auxiliary pattern 123 and the source-drain pattern 129 also have the same shape as each other, and the first dummy pattern 120, the second pattern 124 and the data line 132 have the same shape as each other. Further, the first dummy pattern 124 has the same material and the same layer as the oxide semiconductor layer 119, and the second dummy pattern 132 has the same material and the same layer as the auxiliary pattern 123.

Figure 3F:
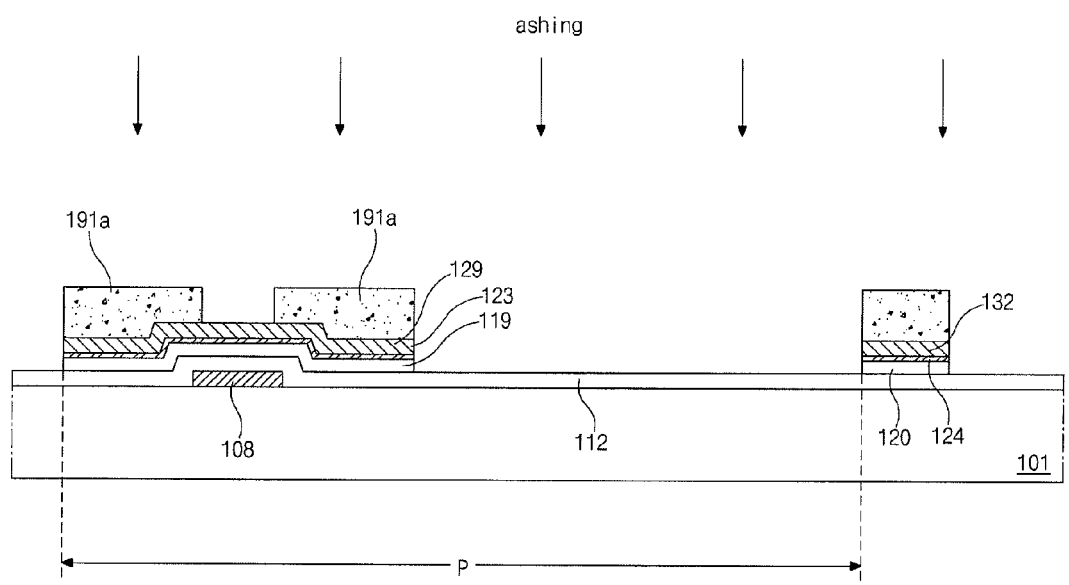
Figure 3G:
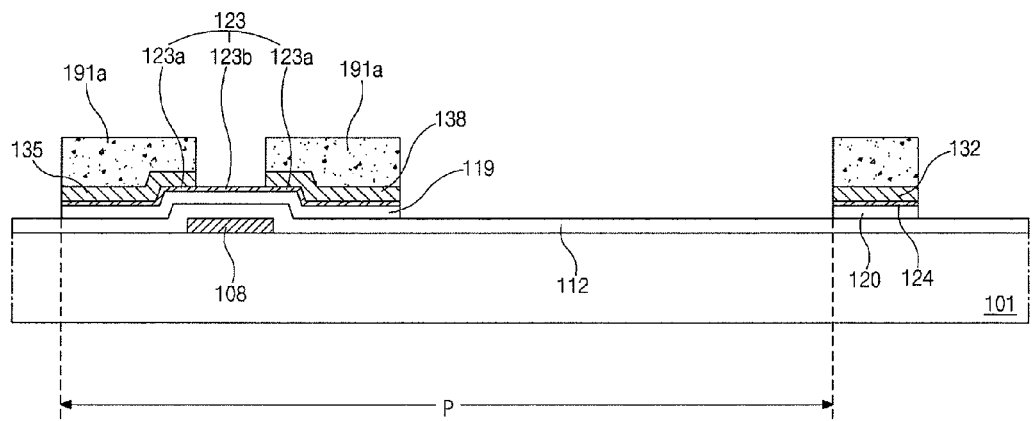

Next, as shown in FIG. 3F, the second PR pattern 191b in FIG. 3E is removed so that a central portion of the source-drain pattern 129 is exposed. Further, the second PR pattern 191b can be removed through an ashing method. Also, although the first PR pattern 191a is partially removed to have a reduced thickness, the first PR pattern 191a remains on the source-drain pattern 129 and the data line 131. As shown in FIG. 3G, the source-drain pattern 129 in FIG. 3F is etched and removed using the first PR pattern 191a as an etching mask so that source and drain electrodes 135 and 138 can be formed on the auxiliary pattern 123. The source-drain pattern 129 can also be patterned through a wet etching method using an etching solution.

Further, the source electrode 135 is connected to the data line 132, and the drain electrode 138 is spaced apart from the source electrode 135. In addition, a central portion of the auxiliary pattern 123 is exposed between the source and drain electrodes 135 and 138 so that the auxiliary pattern 123 can be divided into a first portion 123a under the source and drain electrodes 135 and 138 and a second portion 123b corresponding to the central portion exposed between the source and drain electrodes 135 and 138. The second portion 123b also functions as an etch stopper for protecting the oxide semiconductor layer 119 while the source-drain pattern 129 is etched. In more detail, because the oxide semiconductor layer 119 is covered with the second portion 123b of the auxiliary pattern 123, the oxide semiconductor layer 119 is not exposed to the etching solution of the wet etching method while the source-drain pattern 129 is etched. As a result, the deterioration of a surface of the oxide semiconductor layer 119 such as contamination and damage is prevented.

Figure 3H:
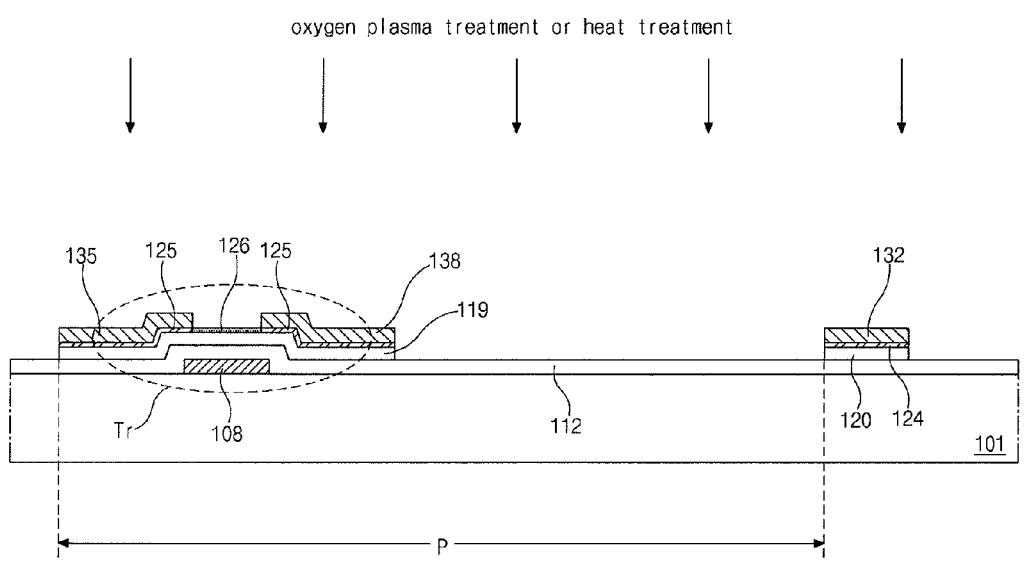

In addition, as shown in FIG. 3H, the first PR pattern 191a in FIG. 3G is removed through a stripping method so that the source electrode 135, the drain electrode 138 and the data line 132 can be exposed. Next, a step for changing a conducting property of the second portion 123b in FIG. 3G of the auxiliary pattern 123 into an insulating property is performed for the substrate 101. For example, the substrate 101 having the second portion 123b including titanium (Ti) or titanium alloy can be treated with an oxygen ($O_2$) plasma in a vacuum chamber including an oxygen gas. Alternatively, the substrate 101 having the second portion 123b of the auxiliary pattern 123 including titanium (Ti) or titanium alloy can be treated with a heat in a heating apparatus such as an oven and a furnace of a temperature of about 300° C. to about 400° C. for a time period of about several tens of seconds to about several tens of minutes.

Also, the second portion 123b, which is an exposed portion of the auxiliary pattern 123 between the source and drain electrodes 135 and 138, including titanium (Ti) or titanium alloy is oxidized to become an oxide layer 126 of titanium oxide (TiOx) having an insulating property. The oxide layer 126 also directly contacts and protects the oxide semiconductor layer 119 between the source and drain electrodes 135 and 138. In addition, since the oxide layer 126 is formed by oxidizating the second portion 123b, an interface property between the oxide layer 126 and the oxide semiconductor layer 119 is superior to an interface property between an insulating layer by deposition and the oxide semiconductor layer 119.

In addition, since the first portion 123a in FIG. 3G under the source and drain electrodes 135 and 138 is not exposed to the oxygen ($O_2$) plasma during the plasma treatment step, the first portion 123a is not oxidized and the conducting property of the first portion 123a is not changed. Alternatively, since the first portion 123a does not contact an oxygen ($O_2$) of an ambient gas during the heat treatment step, the first portion 123a is not oxidized and the conducting property of the first portion 123a is not changed. As a result, the first portion 123a functions as an ohmic contact layer 125 between the oxide semiconductor layer 119 and the source electrode 135 and between the oxide semiconductor layer 119 and the drain electrode 138.

Further, when the auxiliary pattern 123 is relatively thick, the second portion 123b is not entirely oxidized during the plasma treatment step or the heat treatment step such that a lower portion of the second portion 123b remains as a titanium (Ti) layer, and a process time for entirely oxidizing the second portion 123b increases. When the auxiliary pattern 123 is relatively thin, the second portion 123b does not completely protect the oxide semiconductor layer 119. In addition, because the first portion 123a functions as the ohmic contact layer 125 connecting the oxide semiconductor layer 119 and the source and drain electrodes 135 and 138, the auxiliary pattern 123 requires an optimum thickness for the ohmic contact. Accordingly, the auxiliary pattern 123 preferably has a thickness of about 50 Å to about 500 Å.

In addition, the gate electrode 108, the gate insulating layer 112, the oxide semiconductor layer 119, the ohmic contact layer 125, the source electrode 135, the drain electrode 138 and the oxide layer 126 constitute a thin film transistor (TFT) Tr. Further, the central portion of the oxide semiconductor layer 119 exposed between the source and drain electrodes 135 and 138 is covered with and protected by the auxiliary pattern 123 from the etching solution for patterning the source and drain electrodes 135 and 138. In addition, the ohmic contact layer 125 is formed by oxidization of the central portion of the auxiliary pattern 123 instead of etching. As a result, a top surface of the oxide semiconductor layer 119 is not etched and the oxide semiconductor layer 119 has a uniform thickness. Accordingly, the characteristics of the TFT Tr are significantly improved.

Further, right after the oxide semiconductor material layer 118 in FIG. 3C is formed, the auxiliary material layer 122 is formed on the oxide semiconductor material layer 118 through a sputtering method without exposition to a chemical solution and is oxidized to become the oxide layer 126 through an oxygen plasma treatment or a heat treatment. Thus, since the oxide semiconductor layer 119 and the oxide layer 126 are sequentially formed in a relatively short time period, the surface contamination of the oxide semiconductor layer 119 due to exposition to the ambient gas is minimized.

Moreover, since the oxide semiconductor layer 119 and the oxide layer 126 are formed through a sputtering method, the interface property between the oxide semiconductor layer 119 and the oxide layer 126 is superior to the interface property between the oxide semiconductor layer and the inorganic insulating layer including silicon oxide ($SiO_2$) and silicon nitride ($SiN_x$) through a chemical vapor deposition (CVD) method. As a result, the characteristics of the TFT Tr are significantly improved.

In addition, since the top surface of the oxide semiconductor layer 119 is not etched, the oxide semiconductor layer 119 is formed to have an optimum thickness, e.g., about 500 Å to about 1000 Å for an active layer of the TFT Tr instead of a thickness based on partial removal, e.g., about 1500 Å to about 1800 Å. As a result, the material cost and fabrication time are reduced.

Further, when the substrate 101 is used for an organic electroluminescent display device, a power line can be formed on the gate insulating layer 112, and a driving TFT connected to the power line can be formed in the pixel region P. The TFT Tr is then used as a switching TFT and is connected to the driving TFT.

Figure 3I:
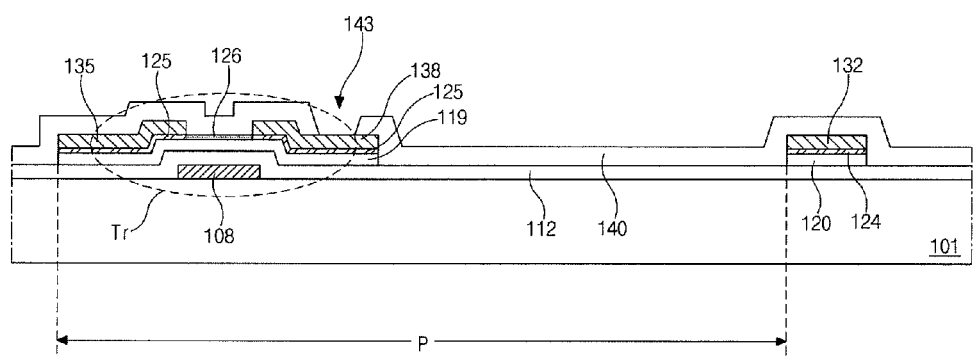
Figure 3J:
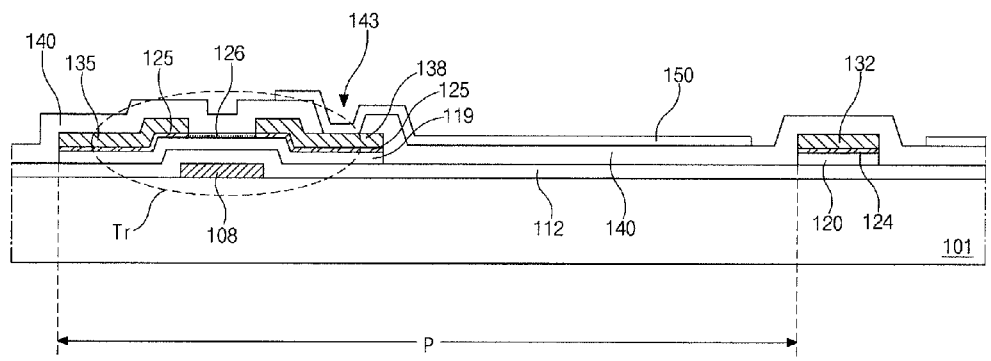

Next, as shown in FIG. 3I, a passivation layer 140 is formed on the source electrode 135, the drain electrode 138, the data line 132 and the oxide layer 126 by depositing and patterning an inorganic insulating material such as silicon oxide ($SiO_2$) and silicon nitride ($SiN_x$) or coating and patterning an organic insulating material such as benzocyclobutene (BCB) and acrylic resin. The passivation layer 140 also has a drain contact hole 143 exposing the drain electrode 138. As shown in FIG. 3J, a pixel electrode 150 is formed on the passivation layer 140 by depositing and patterning a transparent conductive material such as indium-tin-oxide (ITO) and indium-zinc-oxide (IZO). The pixel electrode 150 is also connected to the drain electrode 138 through the drain contact hole 143.

In addition, in an array substrate for an organic electroluminescent display device according to an embodiment of the present invention, a switching TFT and a driving TFT are formed in a pixel region defined by a gate line, a data line and a power line. Further, a gate electrode of the switching TFT is connected to the gate line, and a source electrode of the switching TFT is connected to the data line. Also, a drain electrode of the switching TFT is connected to a gate electrode of the driving TFT, a source electrode of the driving TFT is connected to the power line, and a drain electrode of the driving TFT is connected to an organic electroluminescent diode. Further, the array substrate in FIGS. 3A to 3J is fabricated by a four-mask process. However, in another embodiment, the array substrate may be fabricated by a five-mask process.

Figure 4A:
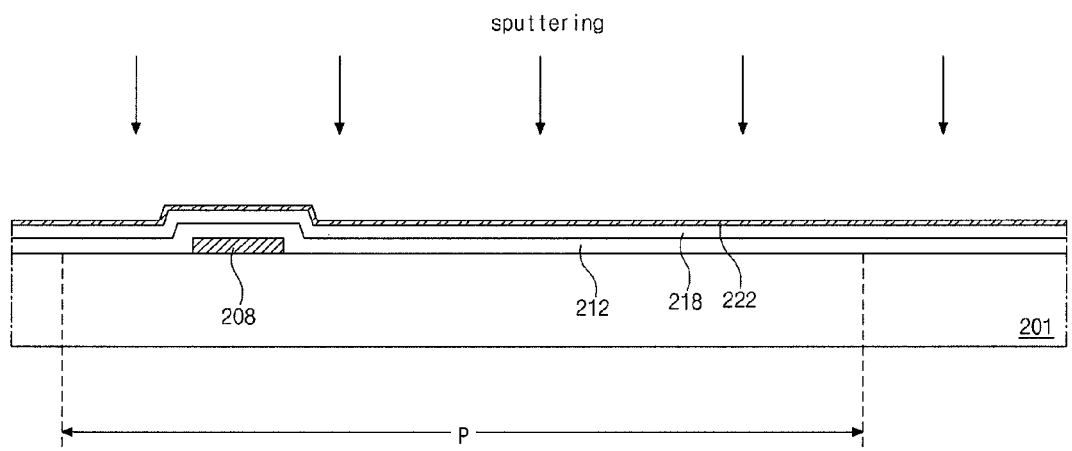
FIGS. 4A to 4E are cross-sectional views showing a method of fabricating an array substrate for a display device according to another embodiment of the present invention.

Next, FIGS. 4A to 4E are cross-sectional views showing a method of fabricating an array substrate for a display device according to another embodiment of the present invention. In FIG. 4A, after a first metal layer is formed on a substrate 201 having a pixel region P, a gate electrode 208 and a gate line are formed by patterning the first metal layer. Next, a gate insulating layer 212, an oxide semiconductor material layer 218 and an auxiliary material layer 222 are sequentially formed on the gate electrode 208 and the gate line through a sputtering method. In addition, the oxide semiconductor material layer 218 includes an oxide semiconductor material such as amorphous indium gallium zinc oxide (a-IGZO) and zinc tin oxide (ZTO), and has a thickness of about 500 Å to about 1000 Å. Further, the auxiliary material layer 222 includes titanium (Ti) or titanium alloy, and has a thickness of about 50 Å to about 500 Å.

Figure 4B:
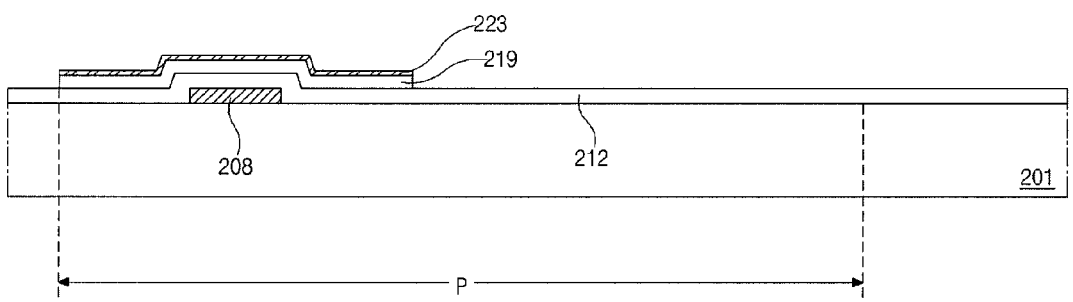

As shown in FIG. 4B, an auxiliary pattern 223 and an oxide semiconductor layer 219 are formed in the pixel region P by patterning the auxiliary material layer 222 and the oxide semiconductor material layer 218 in FIG. 4A. The auxiliary pattern 223 and the oxide semiconductor layer 219 also have the same shape as each other. Next, in FIG. 4C, after a second metal layer is formed on the auxiliary pattern 223, a data line 232, a source electrode 235 and a drain electrode 238 are formed by patterning the second metal layer. Further, the data line 232 crosses the gate line to define the pixel region P, and the source and drain electrodes 235 and 238 are spaced apart from each other. In addition, in this embodiment, first and second dummy patterns are not formed under the data line 232.

Also, the auxiliary pattern 223 are divided into a first portion 223a under the source and drain electrodes 235 and 238 and a second portion 223b corresponding to a central portion exposed between the source and drain electrodes 235 and 238. As shown in FIG. 4D, a conducting property of the second portion 223b in FIG. 4C of the auxiliary pattern 223 is changed into an insulating property by an oxygen ($O_2$) plasma treatment or a heat treatment. For example, the substrate 201 having the second portion 223b including titanium (Ti) or titanium alloy can be treated with an oxygen ($O_2$) plasma in a vacuum chamber including an oxygen gas. Alternatively, the substrate 201 having the second portion 223b of the auxiliary pattern 223 including titanium (Ti) or titanium alloy can be treated with a heat in a heating apparatus such as an oven and a furnace of a temperature of about 300° C. to about 400° C. for a time period of about several tens seconds to about several tens minutes.

In addition, the second portion 223b, which is an exposed portion of the auxiliary pattern 223 between the source and drain electrodes 235 and 238, of titanium (Ti) or titanium alloy is oxidized to become an oxide layer 226 of titanium oxide (TiOx) having an insulating property. Further, the oxide layer 226 directly contacts and protects the oxide semiconductor layer 219 between the source and drain electrodes 235 and 238. Further, since the oxide layer 226 is formed by oxidizating the second portion 223b, an interface property between the oxide layer 126 and the oxide semiconductor layer 219 is superior to an interface property between an insulating layer by deposition and the oxide semiconductor layer 219.

Figure 4C:
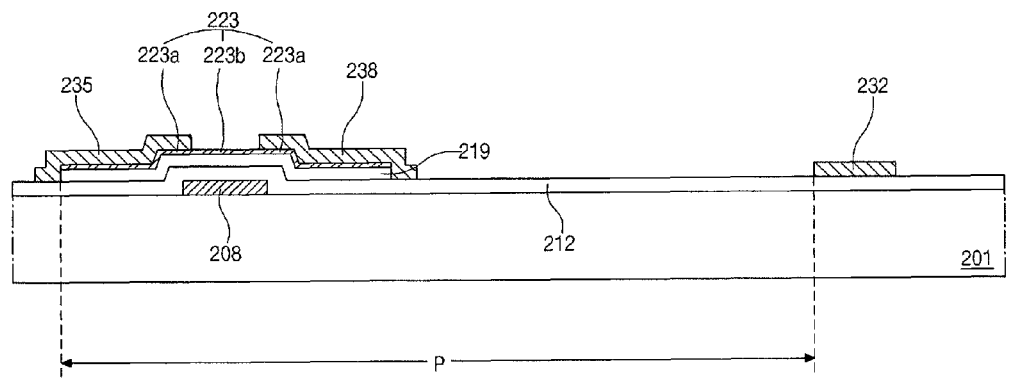
Figure 4D:
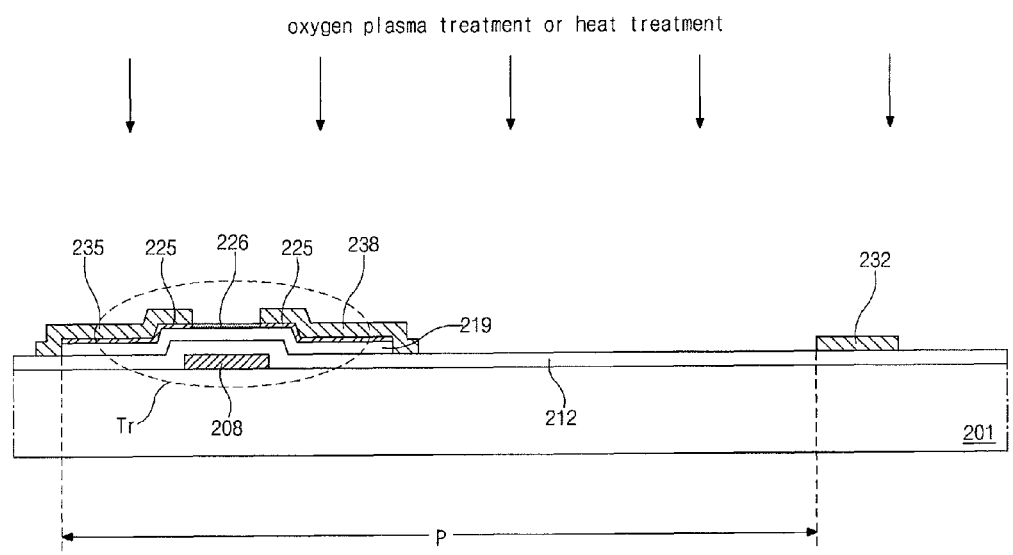

Also, since the first portion 223a in FIG. 4C under the source and drain electrodes 235 and 238 is not exposed to the oxygen ($O_2$) plasma during the plasma treatment step, the first portion 223a is not oxidized and the conducting property of the first portion 223a is not changed. Alternatively, since first portion 223a does not contact an oxygen ($O_2$) of an ambient gas during the heat treatment step, the first portion 223a is not oxidized and the conducting property of the first portion 223a is not changed. As a result, the first portion 223a functions as an ohmic contact layer 225 between the oxide semiconductor layer 219 and the source electrode 235 and between the oxide semiconductor layer 219 and the drain electrode 238.

Figure 4E:
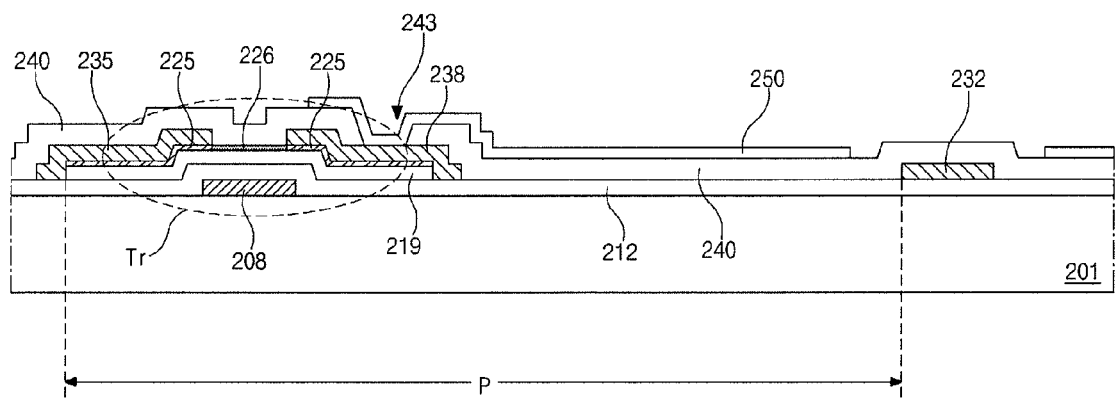

Next, as shown in FIG. 4E, a passivation layer 240 is formed on the source electrode 235, the drain electrode 238, the data line 232 and the oxide layer 226 by depositing and patterning an inorganic insulating material such as silicon oxide ($SiO_2$) and silicon nitride (SiNx) or coating and patterning an organic insulating material such as benzocyclobutene (BCB) and acrylic resin. The passivation layer 240 also has a drain contact hole 243 exposing the drain electrode 238. Next, a pixel electrode 250 is formed on the passivation layer 240 by depositing and patterning a transparent conductive material such as indium-tin-oxide (ITO) and indium-zinc-oxide (IZO). The pixel electrode 250 is connected to the drain electrode 238 through the drain contact hole 243.

Further, the central portion of the oxide semiconductor layer 219 exposed between the source and drain electrodes 235 and 238 is covered with and protected by the auxiliary pattern 223 from the etching solution for patterning the source and drain electrodes 235 and 238. In addition, the ohmic contact layer 225 is formed by oxidizating the central portion of the auxiliary pattern 223 instead of etching. As a result, a top surface of the oxide semiconductor layer 219 is not etched and the oxide semiconductor layer 219 has a uniform thickness. Accordingly, the characteristics of the TFT Tr are improved.

Consequently, in an array substrate for a display device according to an embodiment of the present invention, since the oxide semiconductor layer is covered with and protected by the auxiliary pattern from the etching solution for patterning the source and drain electrodes, the surface damage of the oxide semiconductor layer is prevented and the characteristics of the TFT are improved. Moreover, since the top surface of the oxide semiconductor layer is not etched, the oxide semiconductor layer is formed to have an optimum thickness for an active layer of the TFT, the material cost and fabrication time are reduced and the productivity is improved. In addition, since the oxide semiconductor layer and the oxide layer are formed through a sputtering method, the interface property between the oxide semiconductor layer and the oxide layer is improved and the characteristics of the TFT are further improved.

Further, embodiments of the present invention are advantageous over a TFT including an oxide semiconductor material. In more detail, in the TFT having the semiconductor layer of the oxide semiconductor material and an insulating layer of an inorganic insulating material such as silicon oxide ($SiO_2$) and silicon nitride (SiNx) have a poor interface property and a surface of the semiconductor layer of an oxide semiconductor material is easily contaminated by a chemical solution. As a result, the TFT having the semiconductor layer are deteriorated due to degradation of the surface of the semiconductor layer. The present invention solves this problem.

Further, the oxide semiconductor layer including one of amorphous indium gallium zinc oxide (a-IGZO) and zinc tin oxide (ZTO) is more susceptible to etching than silicon. Thus, one embodiment of the present invention advantageously protects the oxide semiconductor layer over the channel region using metal layer 126, which is thereafter oxidized to produce an insulating layer over the channel region as discussed above.

It will be apparent to those skilled in the art that various modifications and variations can be made in an array substrate for a display device and the method of fabricating the array substrate of the present invention without departing from the spirit or scope of the invention. Thus, it is intended that the present invention cover the modifications and variations of this invention provided they come within the scope of the appended claims and their equivalents.

What is claimed is:

1. A method of fabricating an array substrate, the method comprising:
    forming a gate line and a gate electrode on a substrate having a pixel region, the gate electrode being connected to the gate line;
    forming a gate insulating layer on the gate line and the gate electrode;
    forming an oxide semiconductor layer and an auxiliary pattern on the gate insulating layer, the auxiliary pattern including a conducting material;
    forming source and drain electrodes on the auxiliary pattern and a data line over the gate insulating layer, the source and drain electrodes being disposed over a first portion of the auxiliary pattern and spaced apart from each other to expose a second portion of the auxiliary pattern, the second portion of the auxiliary pattern covering the entire channel region of the oxide semiconductor layer, and the data line crossing the gate line to define the pixel region;
    oxidizing the second portion of the auxiliary pattern of the conducting material into an insulating material;
    forming a passivation layer on the source and drain electrodes and the data line, the passivation layer having a drain contact hole exposing the drain electrode; and
    forming a pixel electrode on the passivation layer, the pixel electrode being connected to the drain electrode through the drain contact hole.

2. The method of claim 1, wherein the oxidized second portion of the auxiliary pattern includes titanium oxide.

3. The method of claim 1, wherein the first portion of the auxiliary pattern includes one of titanium and titanium alloy.

4. The method of claim 1, wherein the oxide semiconductor layer includes one of amorphous indium gallium zinc oxide (a-IGZO) and zinc tin oxide (ZTO).

5. The method of claim 1, wherein the forming the oxide semiconductor layer and the auxiliary pattern and forming the source and drain electrodes and the data line comprise:
    forming an oxide semiconductor material layer, an auxiliary material layer including one of titanium and titanium oxide, and a metal layer on the gate insulating layer through a sputtering method;
    forming first and second photoresist patterns on the metal layer, a thickness of the first photoresist pattern being greater than a thickness of the second photoresist pattern;
    patterning the metal layer, the auxiliary material layer and the oxide semiconductor material layer using the first and second photoresist patterns as an etching mask to form the auxiliary pattern on the oxide semiconductor layer, and a source-drain pattern on the auxiliary pattern and the data line over the gate insulating layer;

removing the second photoresist pattern through an ashing method, the source-drain pattern being exposed through the first photoresist pattern;

patterning the source-drain pattern using the first photoresist pattern as an etching mask to form the source and drain electrodes on the auxiliary pattern; and removing the first photoresist pattern.

6. The method of claim 1, wherein the forming the oxide semiconductor layer and the auxiliary pattern and forming the source and drain electrodes and the data line comprise:

forming an oxide semiconductor material layer and an auxiliary material layer including one of titanium and titanium oxide on the gate insulating layer through a sputtering method;

patterning the auxiliary material layer and the oxide semiconductor material layer to form the oxide semiconductor layer on the gate insulating layer and the auxiliary pattern on the oxide semiconductor layer;

forming a metal layer on the auxiliary pattern; and patterning the metal layer to form the source and drain electrodes on the auxiliary pattern and the data line on the gate insulating layer.

7. The method of claim 1, wherein the oxidizing the second portion of the auxiliary pattern comprises treating the substrate having the second portion of the auxiliary pattern with an oxygen plasma in a vacuum chamber.

8. The method of claim 1, wherein the oxidizing the second portion of the auxiliary pattern comprises treating the substrate having the second portion of the auxiliary pattern with a heat in one of an oven and a furnace of a temperature of about 300° C. to about 400° C. for a time period of about several tens of seconds to about several tens of minutes.

9. The method of claim 1, wherein the oxide semiconductor layer has a thickness of about 500 Å to about 1000 Å, and the auxiliary pattern has a thickness of about 50 Å to about 500 Å.

10. The method of claim 1, further comprising:

forming first and second dummy patterns between the data line and the gate insulating layer.

11. The method of claim 10, wherein the first dummy pattern is simultaneously formed with the oxide semiconductor layer, and the second dummy pattern is simultaneously formed with the first portion of the auxiliary pattern.

* * * * *